US010109835B2

(12) United States Patent
Yang

(10) Patent No.: US 10,109,835 B2
(45) Date of Patent: Oct. 23, 2018

(54) CONNECTOR ASSEMBLY FOR STACKED ELECTRIC POWER MODULES

(71) Applicant: FORMOSA ELECTRONIC INDUSTRIES INC., New Taipei (TW)

(72) Inventor: Kuo-Shun Yang, New Taipei (TW)

(73) Assignee: Formosa Electronic Industries Inc., New Taipei (TW)

( * ) Notice: Subject to any disclaimer, the term of this patent is extended or adjusted under 35 U.S.C. 154(b) by 138 days.

(21) Appl. No.: 15/364,797

(22) Filed: Nov. 30, 2016

(65) Prior Publication Data

US 2018/0062145 A1 Mar. 1, 2018

(30) Foreign Application Priority Data

Aug. 25, 2016 (TW) ............................. 105213129 A

(51) Int. Cl.

*H01M 10/20* (2006.01)
*H01M 10/10* (2006.01)
*H01M 2/20* (2006.01)
*H01M 2/10* (2006.01)
*H01R 31/06* (2006.01)
*H01R 9/24* (2006.01)
*H05K 5/00* (2006.01)

(52) U.S. Cl.

CPC ......... *H01M 2/202* (2013.01); *H01M 2/1016* (2013.01); *H01M 2/1061* (2013.01); *H01M 2/1077* (2013.01); *H01R 9/2408* (2013.01); *H01R 31/06* (2013.01); *H05K 5/0021* (2013.01)

(58) Field of Classification Search

None

See application file for complete search history.

(56) References Cited

U.S. PATENT DOCUMENTS 6,310,783 B1 * 10/2001 Winch ................ H01M 2/1077 361/679.02
9,559,446 B1 * 1/2017 Wetzel ............... H01R 12/7088
9,692,023 B2 * 6/2017 Shimoda ............. H01M 2/1016
9,761,856 B2 * 9/2017 Kim ....................... H01M 2/204
2009/0305116 A1 * 12/2009 Yang ................... H01M 2/0212 429/61
2010/0035142 A1 * 2/2010 Ha ....................... H01M 2/0207 429/153
2010/0221584 A1 * 9/2010 Reber ................. H01M 2/1022 429/7
2010/0247979 A1 * 9/2010 Ha ....................... H01M 2/1077 429/7
2011/0059342 A1 * 3/2011 Lee ..................... H01M 2/1077 429/93

(Continued)

*Primary Examiner* — Scott J. Chmielecki

(74) *Attorney, Agent, or Firm* — Rosenberg, Klein & Lee

(57) ABSTRACT

A connector assembly is provided for stacked electric power modules. Each of the electric power modules includes a front board, a back board, a top board, a bottom board, a left side board, a right side board, and a battery pack contained in the electric power module. The back board of the electric power module includes a connector module mounted thereto and the connector module includes at least one power connector connected to the battery pack and at least one signal connector. The at least one power connector and the at least one signal connector of the connector module are arranged to project beyond a horizontal surface of the top board.

7 Claims, 9 Drawing Sheets

1 13 M1 11 41 15 16 63 61 12 14 71 7 42 3a 3

(56) References Cited

U.S. PATENT DOCUMENTS

| | | | | |
|---|---|---|---|---|
| 2011/0248680 | A1* | 10/2011 | Timmons | H01M 2/1072 320/120 |
| 2012/0058381 | A1* | 3/2012 | Carignan | B60L 3/0069 429/158 |
| 2013/0149571 | A1* | 6/2013 | Lee | B60L 11/1879 429/61 |
| 2013/0176688 | A1* | 7/2013 | Shen | H02J 7/0045 361/736 |
| 2013/0330588 | A1* | 12/2013 | Ahn | H01M 2/1016 429/99 |
| 2014/0242423 | A1* | 8/2014 | Jones | H01M 2/1241 429/50 |
| 2015/0280336 | A1* | 10/2015 | Itou | H01M 2/30 439/625 |
| 2017/0008417 | A1* | 1/2017 | Yoshida | H01M 2/105 |

* cited by examiner

CONNECTOR ASSEMBLY FOR STACKED ELECTRIC POWER MODULES

BACKGROUND OF THE INVENTION

1. Field of the Invention

The present invention relates to a connection structure of an electric power module, and in particular to a connector assembly for stacked electric power modules.

2. The Related Arts

Electric power modules have been widely used in various electric appliances for storage of electric power and supply of the stored electric power. For combination of multiple electric power modules, a conventional arrangement of electric power modules comprises a metal housing that surrounds a frame or a box structure and a battery pack is then deposited and fixed inside the frame or the box by means of locks, such as bolts, retention bars, retention tabs, and rivets, and is then connected with a connector or a connection cable. Such a conventional arrangement has several drawbacks, such as being hard to assemble, being difficult to disassemble and maintain, and high material costs for the frame.

Further, when multiple electric power modules are combined to form an enlarged electric power module, power lines and signal lines of the multiple electric power modules must be connected to each other. Heretofore, a common practice is to provide connector sockets on a back side of each of the electric power module and electric cables are inserted, one by one, into the connection sockets by means of external plugs. This operation causes a great waste of labor cost of assembly and generally relies on skilled operators. In addition, the cables are located on the back side of the electric power modules in a disordered and messy manner, leading to poor visual perception and difficulty of maintenance, and also causing security and safety issues.

SUMMARY OF THE INVENTION

An objective of the present invention is to provide a connector assembly for stacked electric power modules, which allows multiple electric power modules to achieve connection of power and signal among stacked and combined electric power modules through simple connection structure and easy operation.

The present invention provides a connector assembly for stacked electric power modules. Each of the electric power modules comprises a front board, a back board, a top board, a bottom board, a left side board, a right side board, and a battery pack. The back board of the electric power module comprises a connector module mounted thereto and the connector module comprises at least one power connector and at least one signal connector. The at least one power connector and the at least one signal connector of the connector module are arranged to project beyond a horizontal surface of the top board.

The connector assembly for stacked electric power modules according to the present invention allows multiple electric power modules to achieve power and signal connection among the electric power modules that are stacked and combined together through a simple connection structure and an easy operation, without the need for complicated external plugging devices and connection sockets and also without complicated external connection cables, so that issues of time and cost required for manual assembling and reliance on skilled operator can be completely eliminated and also, issues of poor visual perception, difficult maintenance, and safety resulting from disorderly exposure of cables/lines on the back side of the electric power module can be overcome.

BRIEF DESCRIPTION OF THE DRAWINGS

The present invention will be apparent to those skilled in the art by reading the following description of preferred embodiments of the present invention, with reference to the attached drawings, in which.

DETAILED DESCRIPTION OF THE PREFERRED EMBODIMENTS

Figure 1:
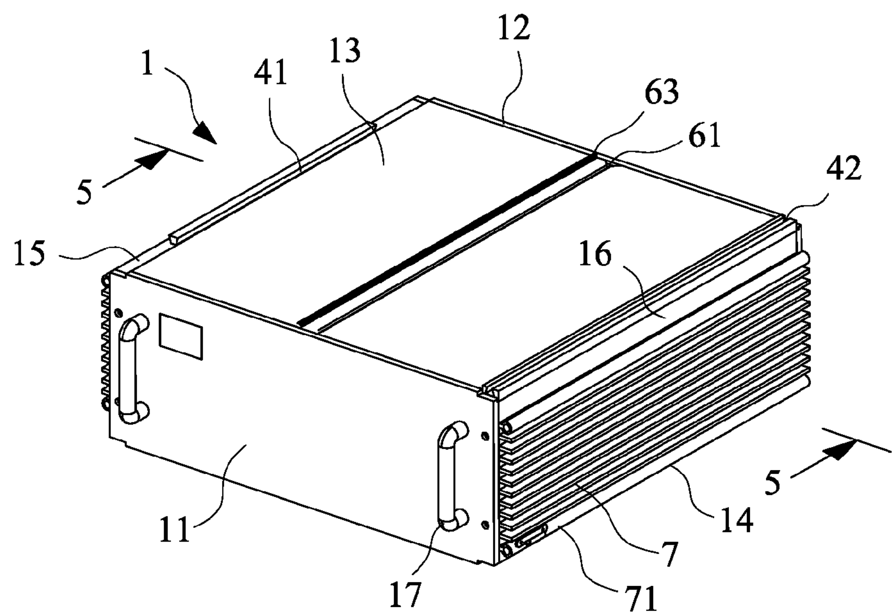
FIG. 1 is a perspective view showing an embodiment of the present invention.
Figure 2:
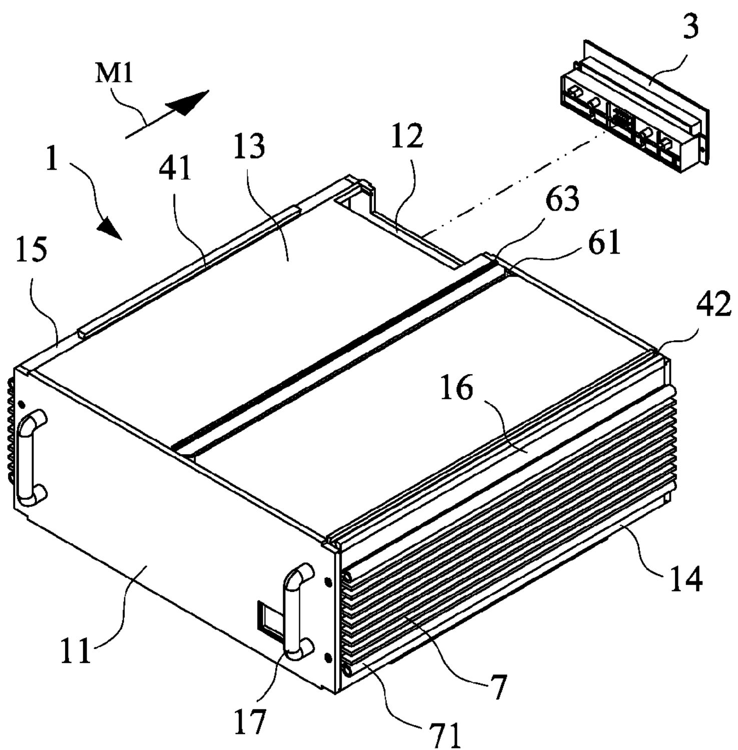
FIG. 2 is an exploded view of FIG. 1 with parts being detached.
Figure 3:
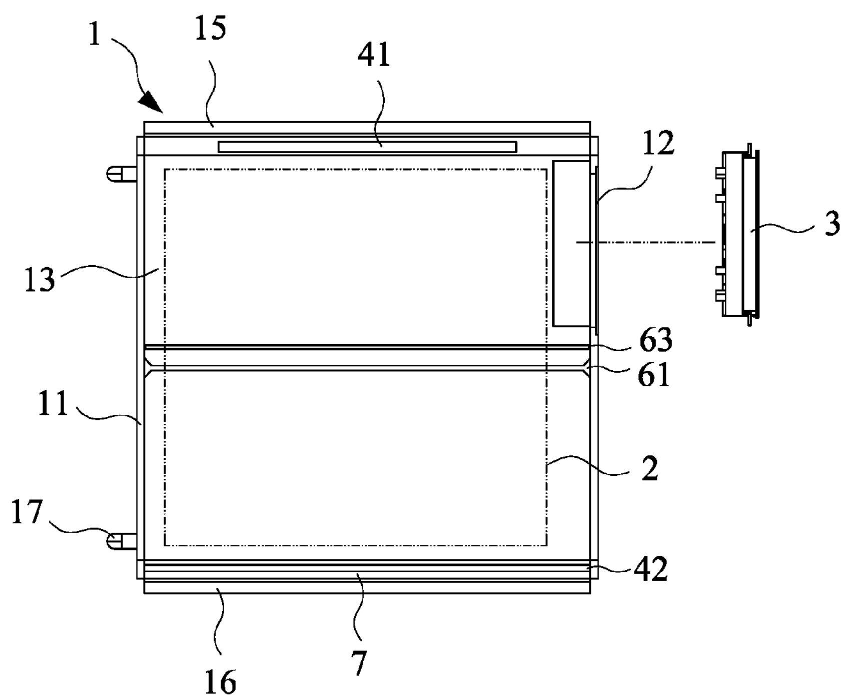
FIG. 3 is a top plan view of FIG. 2.
Figure 4:
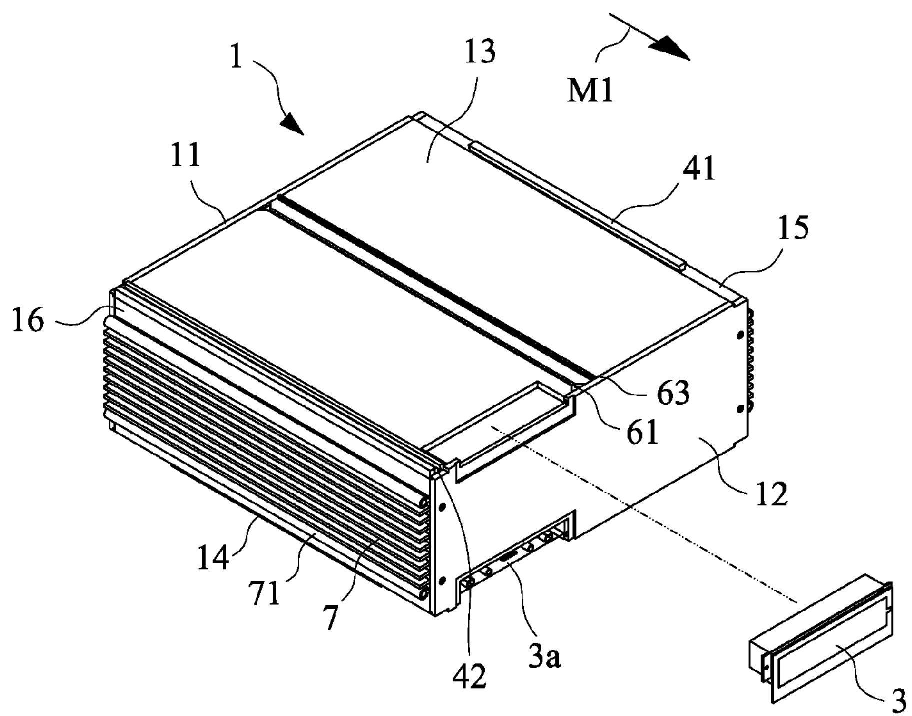
FIG. 4 is an exploded view of the present invention, taken from the front side, with parts being detached.

Referring to FIGS. 1-4, FIG. 1 is a perspective view, taken from a front side, showing an embodiment of the present invention; FIG. 2 is an exploded view of FIG. 1, taken from the front side, with parts being detached; FIG. 3 is a top plan view of FIG. 2; and FIG. 4 is an exploded view of the present invention, taken from the front side, with parts being detached.

As shown in the drawings, an electric power module 1 comprises an interior space defined among and by a front board 11, a back board 12, a top board 13, a bottom board 14, and a left side board 15 and a right side board 16 that are opposite to each other. A battery pack 2 is received and fixed in the interior space of the electric power module 1. The front board 11 of the electric power module 1 comprises two handles 17 mounted thereto to allow for easy operation by a user for sliding of the electric power module 1.

The back board 12 of the electric power module 1 is provided with a connector module 3 at a location adjacent to the top board 13. The back board 12 of the electric power module 1 is provided with a counterpart insertion receptacle assembly 3*a* mounted thereto at a location adjacent to the bottom board 14.

Figure 5:
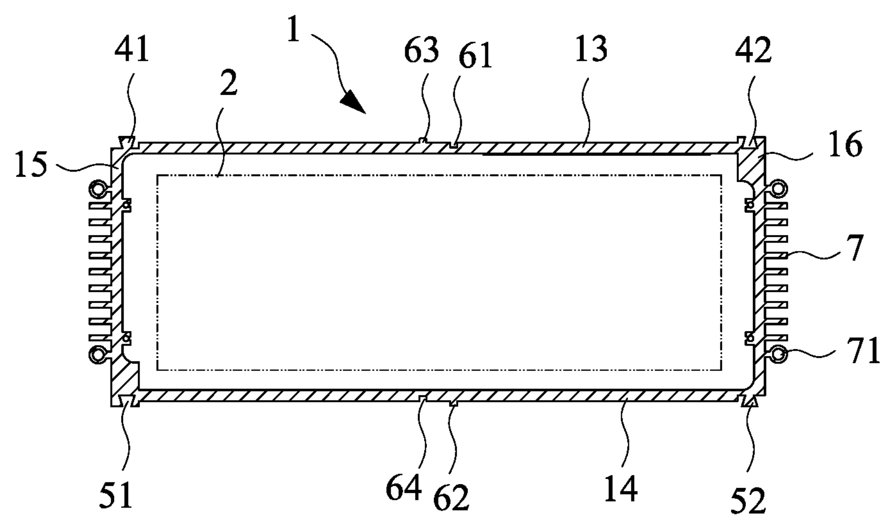
FIG. 5 is a cross-sectional view taken along line 5-5 of FIG. 1.

Referring also to FIG. 5, the top board 13 of the electric power module 1 is provided, on a left top edge and a right top edge thereof, with a left slide structure 41 and a right slide structure 42 that extend in a movement direction M1.

The bottom board 14 of the electric power module 1 is provided, on a left bottom edge and a right bottom edge thereof, with a counterpart left slide structure 51 and a counterpart right slide structure 52 that extend in the movement direction M1 and respectively correspond to the left top edge 41 and the right top edge 42.

With the structural arrangement involving the left slide structure 41, the right slide structure 42, the counterpart left slide structure 51, and the counterpart right slide structure 52, more than two electric power modules 1 can be combined together by being stacked sequentially over each other and connection made between the connector modules 3 and the counterpart insertion receptacle assemblies 3*a* thereof allows for formation of an expanded, large-sized electric power module. In the embodiment of the present invention, the left slide structure 41, the right slide structure 42, the counterpart left slide structure 51, and the counterpart right slide structure 52 can be a slide structure involving dovetailed structures that correspond to and mate each other or any other corresponding and mated structures for sliding movement, such as guide rail and mating guide slot.

The top board 13 of the electric power module 1 is further formed with an alignment slot 61 extending in the movement direction M1. The bottom board 14 of the electric power module 1 is further formed with an alignment rail 62 that extends in the movement direction M1 and corresponds to the alignment slot 61. The top board 13 is additionally provided with an ancillary rail 63 formed thereon at a location adjacent to the alignment slot 61; and the bottom board 14 is additionally provided with an ancillary slot 64 formed therein at a location adjacent to the alignment rail 62.

The left side board 15 and the right side board 16 of the electric power module 1 are each formed with a heat dissipation fin assembly 7 to provide excellent heat dissipation to the electric power module 1. Further, the heat dissipation fin assembly 7 is provided with at least one coolant liquid channel 71, which is connected with piping (not shown) and receives coolant liquid supplied into the coolant liquid channel 71 to provide an improved effect of heat dissipation.

Figure 6:
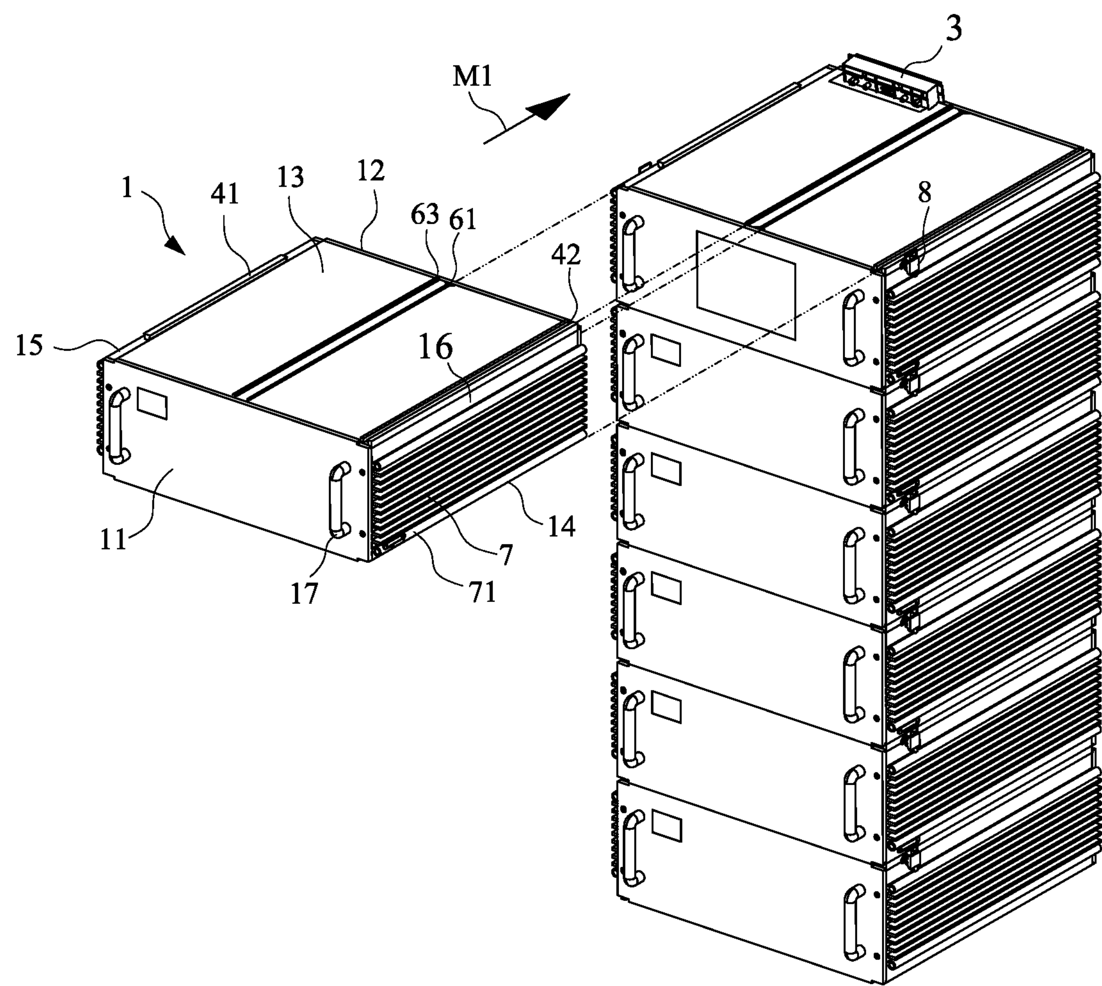
FIG. 6 is a perspective view illustrating multiple electric power modules being stacked and combined through a sliding operation according to the present invention.
Figure 7:
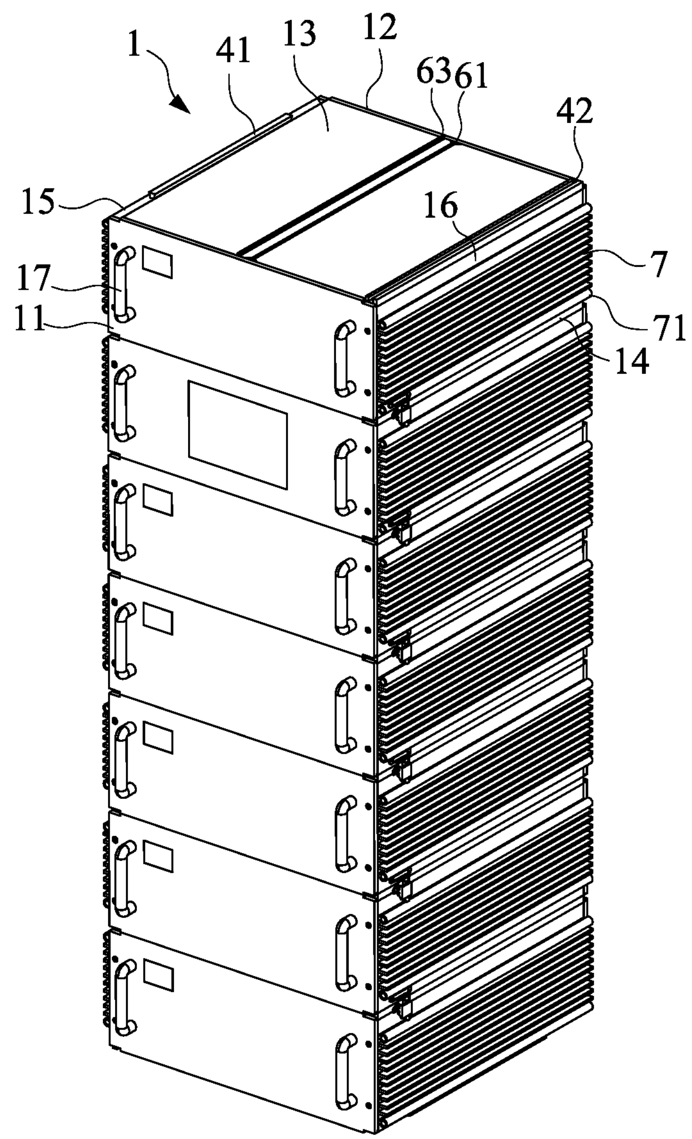
FIG. 7 is a perspective view, taken from a front side, illustrating multiple electric power modules being stacked and combined together according to the present invention.
Figure 8:
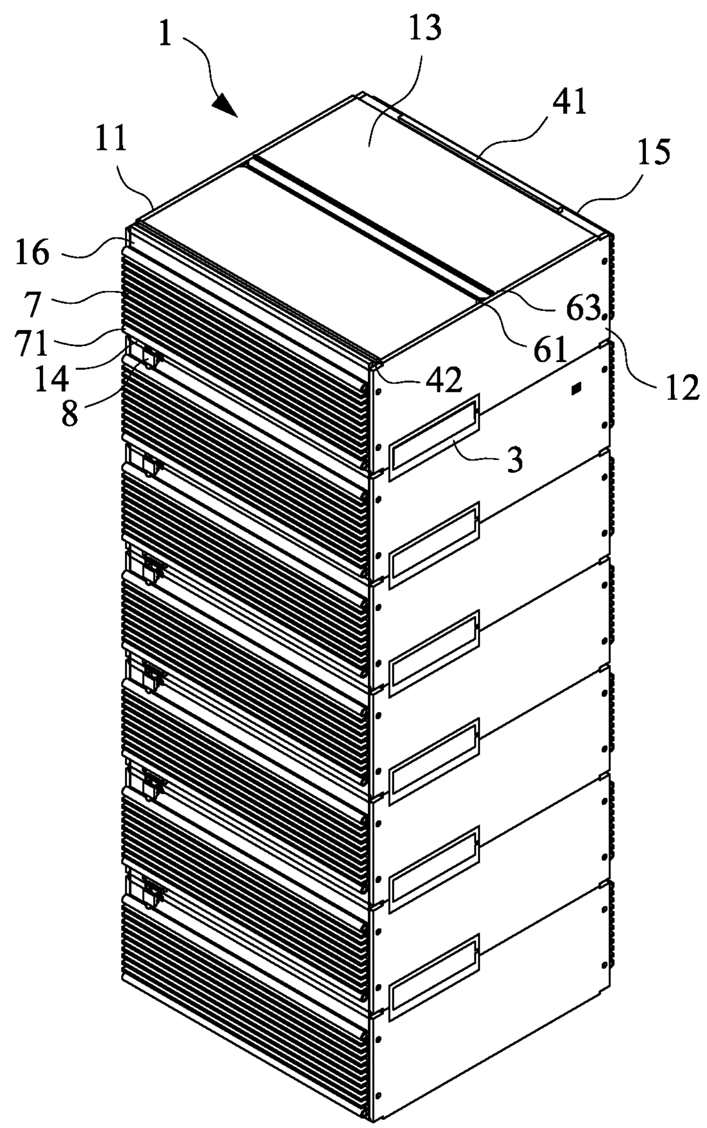
FIG. 8 is a perspective view, taken from a rear side, illustrating multiple electric power modules being stacked and combined together through a sliding operation according to the present invention.

FIG. 6 is a perspective view, taken from a front side, illustrating multiple electric power modules 1 being stacked and combined through a sliding operation according to the present invention. FIG. 7 is a perspective view, taken from a front side, illustrating multiple electric power modules being stacked and combined together according to the present invention. FIG. 8 is a perspective view, taken from a rear side, illustrating multiple electric power modules 1 being stacked and combined together through a sliding operation according to the present invention.

To stack an additional, upper-side electric power module, which has the same structure, on the electric power module 1 in a manner of being vertically adjacent to each other, a counterpart left slide structure and a counterpart right slide structure of the upper-side electric power module are respectively brought into alignment the left slide structure 41 and the right slide structure 42 of the electric power module 1 and a movement is made in the movement direction M1 such that the upper-side electric power module is coupled, through the sliding movement, to the top board 13 of the electric power module 1.

The bottom board 14 of the electric power module 1 is also combinable with a lower-side electric power module that has the same structure. To combine and couple together the electric power module 1 and the lower-side electric power module, a left slide structure and a right slide structure of the lower-side electric power module are respectively brought into alignment with the counterpart left slide structure 51 and the counterpart right slide structure 52 of the electric power module 1 and a movement is made in the movement direction M1 such that the lower-side electric power module is stacked under and coupled to the bottom board 14 of the electric power module 1.

The stacked combination of the electric power module 1 with the adjacent modules is achieved through alignment between the alignment slot 61 and the alignment rail 62, as well as the ancillary rail 63 and the ancillary slot 64, in order to provide an effect of guiding for the sliding movement.

After the electric power modules have been combined through the sliding movements, a lock 8, which is provided on the left side board 15 and the right side board 16, may be applied to securely lock together the electric power modules that are vertically adjacent to each other.

Figure 9:
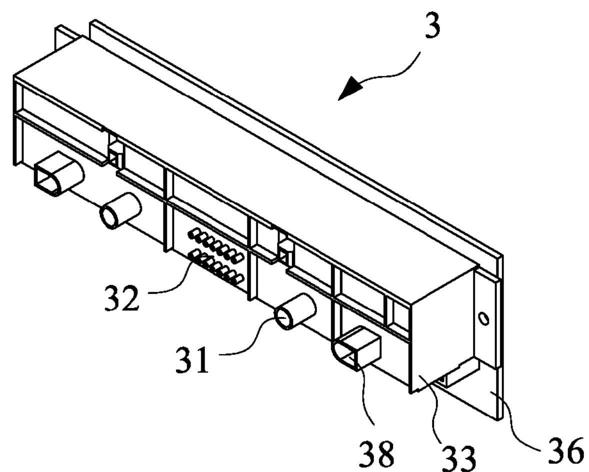
FIG. 9 is a perspective view, in an enlarged form, illustrating a connector assembly according to the present invention.
Figure 10:
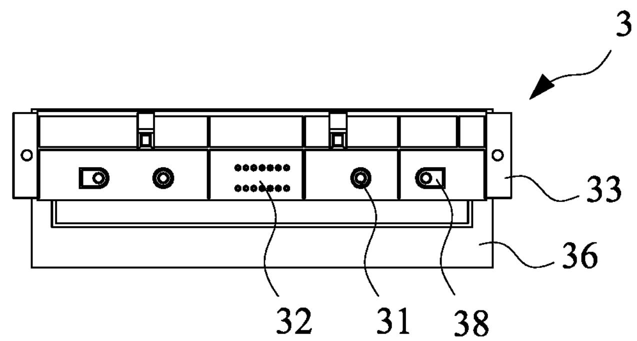
FIG. 10 is a schematic front view of the connector assembly according to the present invention.
Figure 11:
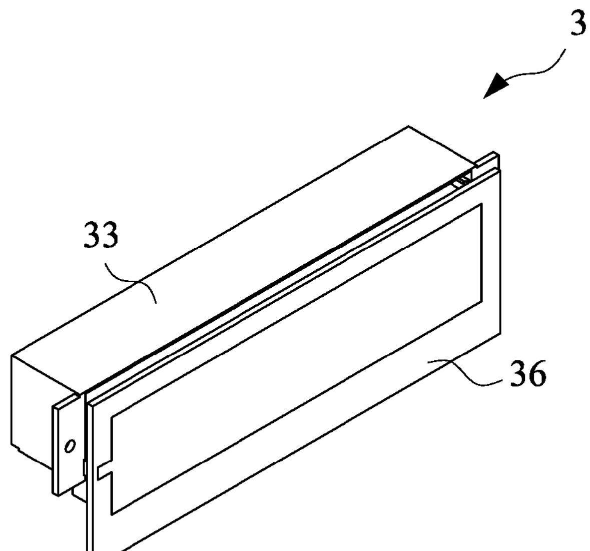
FIG. 11 is a perspective view, taken from a rear side, showing the connector assembly according to the present invention.

FIG. 9 is a perspective view, in an enlarged form, illustrating a connector assembly according to the present invention; FIG. 10 is a schematic front view of the connector assembly according to the present invention; and FIG. 11 is a perspective view, taken from a rear side, showing the connector assembly according to the present invention. As shown in the drawings, the connector module 3 comprises at least one power connector 31 that are connected to the battery pack 2 and at least one signal connector 32.

The at least one power connector 31 and the at least one signal connector 32 of the connector module 3 are arranged at locations that project beyond a horizontal surface of the top board 13 so that when an upper-side electric power module of the same structure is stacked on the electric power module 1, two counterpart slide structures provided on a bottom board of the upper-side electric power module are set corresponding to the left slide structure 41, the right slide structure 42 provided on the top board 13 of the electric power module 1 and the upper-side electric power module is pushed to move in the movement direction M1 to bring the counterpart insertion receptacle assembly 3*a* of the upper-side electric power module into alignment with and thus inserted into the connector module 3 of the electric power module 1.

The connector module 3 is arranged to form a flat and smooth surface with respect to the back board 12 of the electric power module 1. Thus, when multiple electric power modules are stacked and combined, the back surfaces of the electric power modules collectively form a combined, unitary flat and smooth surface that does not suffer any issues of exposed cables/line entangling each other.

Figure 12:
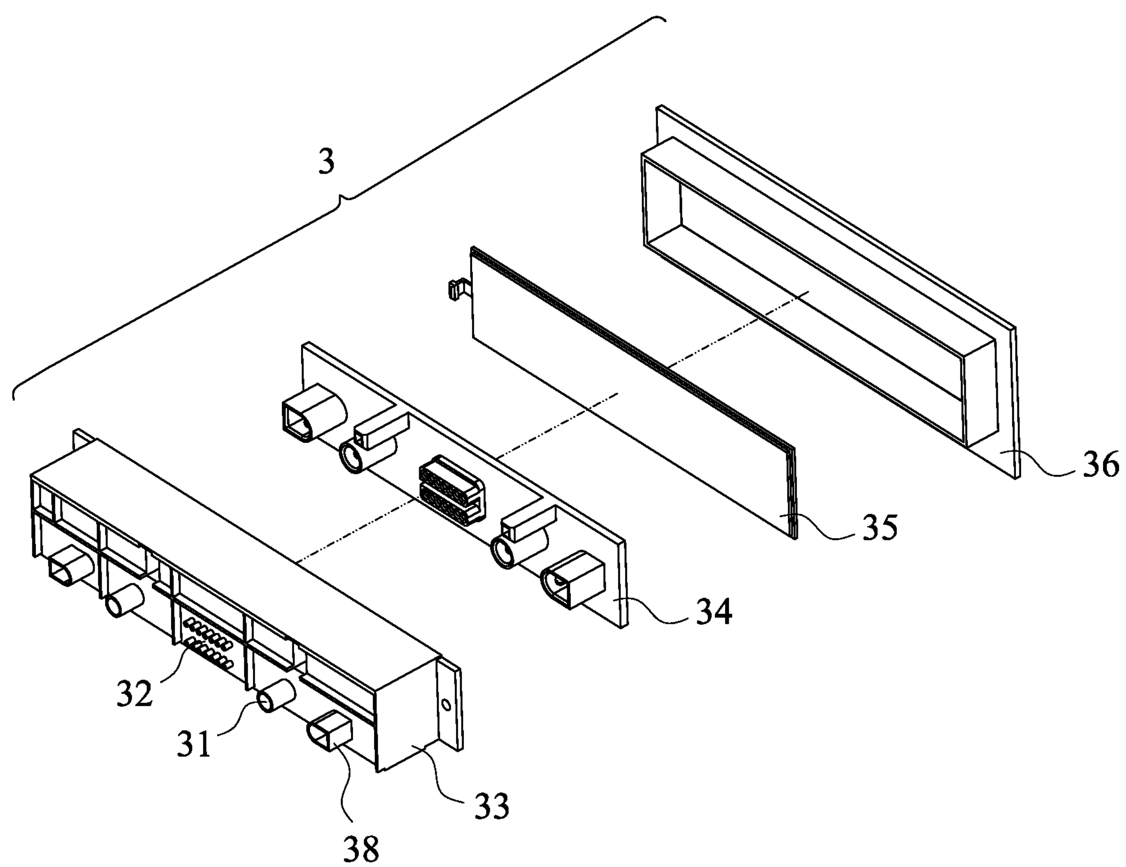
FIG. 12 is an exploded view, taken from a front side, illustrating the connector assembly according to the present invention, with parts thereof being detached from each other.
Figure 13:
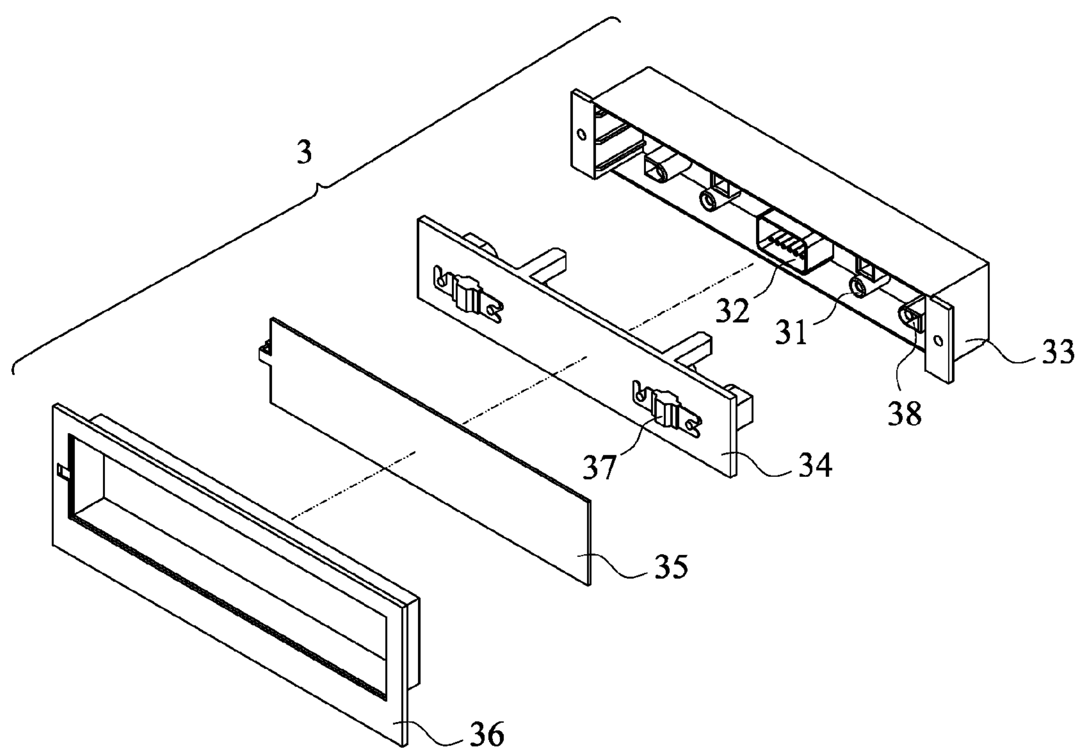
FIG. 13 is an exploded view, taken from a rear side, illustrating the connector assembly according to the present invention, with parts thereof being detached from each other.

FIG. 12 is an exploded view, taken from a front side, illustrating the connector assembly according to the present invention, with parts thereof being detached from each other; and FIG. 13 is an exploded view, taken from a rear side, illustrating the connector assembly according to the present invention, with parts thereof being detached from each other. As shown in the drawings, the connector module 3 according to the present invention comprises at least one power connector 31, at least one signal connector 32, a casing 33, a circuit substrate 34, a protector plate 35, and a cover plate 36. The circuit substrate 34 is provided with at least one fuse 37 for electric overloading protection. Further, the connector module 3 is additionally provided with at least one insertion guide section 38, such that when the counterpart insertion receptacle assembly 3*a* is inserted into the connector module 3, the insertion guide section 38 helps guide them into correct alignment for insertion.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A connector assembly for stacked electric power modules, wherein each of the electric power modules is provided with a front board, a back board, a top board, a bottom board, a left side board, a right side board and an battery pack contained in the electric power module, the connector assembly comprising:

a connector module mounted to the back board of each electric power module at a location adjacent to the top board, the connector module including at least one power connector connected to the battery pack and at least one signal connector;

the at least one power connector and the at least one signal connector of the connector module being arranged to project beyond a horizontal surface of the top board of the electric power modules; and a counterpart insertion receptacle assembly corresponding to the connector module, which is mounted to the back board of the electric power module at a location adjacent to the bottom board.

2. The connector assembly as claimed in claim 1, wherein the connector module comprises a circuit substrate provided with at least one fuse thereon.

3. The connector assembly as claimed in claim 1, wherein the connector module comprises at least one insertion guide section for guiding the counterpart insertion receptacle assembly to be inserted into the connector module.

4. The connector assembly as claimed in claim 1, wherein the connector module is arranged to form a flat and smooth surface with respect to the back board of the electric power module.

5. The connector assembly as claimed in claim 1, wherein the left side board and the right side board of the electric power module are provided with a heat dissipation fin assembly respectively.

6. The connector assembly as claimed in claim 1, wherein the left side board and the right side board of the electric power module are each provided with at least one coolant liquid channel formed thereon.

7. The connector assembly as claimed in claim 1, wherein the left side board and the right side board of the electric power module are each provided with a lock.

* * * * *